US012306238B2

(12) United States Patent
Mäkikyrö

(10) Patent No.: US 12,306,238 B2
(45) Date of Patent: May 20, 2025

(54) SUPPORT STRUCTURE FOR A DEVICE UNDER TEST ALLOWING ROTATION

(71) Applicant: VERKOTAN OY, Oulu (FI)

(72) Inventor: Pertti Mäkikyrö, Oulu (FI)

(73) Assignee: VERKOTAN OY, Oulu (FI)

( * ) Notice: Subject to any disclaimer, the term of this patent is extended or adjusted under 35 U.S.C. 154(b) by 165 days.

(21) Appl. No.: 18/258,800

(22) PCT Filed: Dec. 2, 2021

(86) PCT No.: PCT/FI2021/050836
§ 371 (c)(1),
(2) Date: Jun. 21, 2023

(87) PCT Pub. No.: WO2022/136727
PCT Pub. Date: Jun. 30, 2022

(65) Prior Publication Data
US 2024/0044962 A1    Feb. 8, 2024

(30) Foreign Application Priority Data
Dec. 22, 2020   (FI) .................... 20206357

(51) Int. Cl.
*G01R 29/10* (2006.01)
*G01R 29/08* (2006.01)

(52) U.S. Cl.
CPC ......... *G01R 29/10* (2013.01); *G01R 29/0892* (2013.01)

(58) Field of Classification Search
CPC . G01R 29/10; G01R 29/0871; G01R 29/0892
See application file for complete search history.

(56) References Cited

U.S. PATENT DOCUMENTS 10,302,735 B2    5/2019   Morita
10,523,801 B1 *  12/2019  Rowell .............. G01R 29/105
(Continued)

FOREIGN PATENT DOCUMENTS

DE    102011082008 A1    3/2013
JP       H0262970 A      3/1990

OTHER PUBLICATIONS

Rohde & Schwarz, Precise Antenna Characterization. In: [online], Aug. 7, 2014, [retrieved on Dec. 15, 2023]. Retrieved from https:cdn.rohde-schwarz.com/magazine/pdfs_1/issue/NEWS_211_english_150dpi.pdf, 68 pgs.

(Continued)

*Primary Examiner* — Eman A Alkafawi
*Assistant Examiner* — Suresh K Rajaputra
(74) *Attorney, Agent, or Firm* — Merchant & Gould P.C.

(57) ABSTRACT

A support structure for a device under test, (DUT), allows rotation, through a rotatable inner compartment applicable to fix, rotate and/or move the DUT. The inner compartment is manufactured of polymethacrylimide or other substantially RF-transparent material, and the inner compartment encloses, holds or attaches to the DUT, so that the inner compartment is made immobile relative to the DUT. The inner compartment is rotated by a first motor, so the DUT is placeable in a desired alignment angle between two conducted measurements requiring two different alignment angles. When measuring, the inner compartment remains in place and fixed with the DUT. A second motor is applicable for linear movement of the arrangement. A testing method for the DUT tests different temperatures by using two concentric compartments, and by feeding air having a desired temperature to the intermediate volume, and having through-holes on the wall of the inner compartment.

22 Claims, 7 Drawing Sheets

(56) References Cited

U.S. PATENT DOCUMENTS

| | | | |
|---|---|---|---|
| 2009/0231217 A1 | 9/2009 | Grange | |
| 2012/0286122 A1* | 11/2012 | Tankielun | G01R 29/0864 |
| | | | 248/346.06 |
| 2017/0016944 A1 | 1/2017 | Esplin | |
| 2018/0343069 A1* | 11/2018 | Taylor | H04B 17/10 |
| 2020/0088775 A1 | 3/2020 | Anton | |
| 2020/0150170 A1* | 5/2020 | Rowell | G01R 29/105 |

OTHER PUBLICATIONS

Finnish Office Action received for FI Serial No. 20206357 on Dec. 21, 2023, 10 pgs.
International Search Report and Written Opinion received for PCT Serial No. PCT/FI2021/050836 on Mar. 18, 2022, 10 pgs.
Finnish Search Report received for Finnish Serial No. 20206357 on Jun. 21, 2021, 2 pgs.

* cited by examiner

SUPPORT STRUCTURE FOR A DEVICE UNDER TEST ALLOWING ROTATION

This application is a National Stage Application of PCT/FI2021/050836, filed Dec. 2, 2021, which claims benefit of priority to application Ser. No. 20/206,357, filed Dec. 22, 2020 in Finland, and which applications are incorporated herein by reference. To the extent appropriate, a claim of priority is made to each of the above-disclosed applications.

FIELD OF THE INVENTION

The present invention relates to various testing situations and environments of radio devices, such as mobile phones and smartphones, which allow rotation and temperature testing of the radio device without affecting the radio channel in a disturbing way.

BACKGROUND OF THE INVENTION

Mobile devices with radio transceivers can be tested right after the manufacturing process of such devices, or later during the life cycle of the device. Usually such devices, which can be called DUTs (Device Under Test), can be tested in dedicated, echoless (or inpractice, highly absorbing for RF signals) chambers, i.e. quiet chambers, where the inner walls, floor and ceiling (i.e. all visible surfaces) can be coated by e.g. pyramid shaped "foam" type of material, which effectively absorbs signals in radio frequencies. The dedicated shape has proven to be advantageous in absorbing properties of the material. Such a chamber is provided with the TX (transmitter) antenna or device, and the DUT can be an RX (receiving) antenna or device. It is also possible to exchange the roles, so that the DUT is a transmitting device (TX), while another device is a receiving device (RX). The beam forms of the antennas can be manually tuned to point towards each other, and/or there can be other kinds of adjustment ways such as motor-assisted platforms or electrical tuning of the beam direction in case of an antenna array, for instance.

The TX and RX antenna need to be placed on some kind of a platform or a support structure such as along a rod or arm within the measurement chamber, which is covered by absorbers along its inner surfaces. It is not reasonable to just place the DUT on the floor on a foamed absorber, as the field calculations become easier when the device antennas are farther away from the inner surfaces of the chamber. In any way, required wirings into the antenna array also represent a physical matter inside the chamber, which affects the radio channel properties within the chamber. However, usually the TX and RX devices are desired to be placed around halfway of the total height of the echoless chamber, so that the TX device is in a left-hand side half volume of the chamber, and the RX device is respectively in a right-hand side half volume of the chamber. In case there are several devices within the echoless chamber, each of them needs to be supported on a platform, or at an end of a rod or arm, for instance. Furthermore, as introduced already above, rotational tables and platforms, and even motors within the echoless chamber will seriously affect the "ideality" of the echoless chamber, meaning that every physical obstacle (i.e. a piece of matter) having an effect to the radio signal propagating through it (either by absorbment or reflections) is a defect in such an ideality. These negative effects will harm the measurements, and it would be best to mitigate such effects completely or at least partially.

A problem in the prior art arises, when considering the size of the so-called quiet zone of an anechoic chamber during the measurement involving radio devices with their antennas. A volume inside the chamber, where the reflections from the walls and the like will be notably smaller than the actual received signal of interest, can be called as the quiet zone of the chamber. The DUT is preferably placed there for the measurements. However, if the quiet zone is large, the signal could change in a much larger fashion, than in a smaller volume called as the quiet zone. Therefore, the measurement accuracy increases if we can operate in a volumetrically small area, which is within the quiet zone. Simultaneously, if that is the case, the quiet zone can be minimized and the measurement quality will remain good. The problem is to find an arrangement and a manipulating system for the DUT, which enables this.

In prior art, there are different rotational tables, which can be a bit similar in principle like a rotating, round-shaped part of the floor on the theatre stage. When the same principle is applied to the RF measurements within anechoic chambers, it can be a platform, which is rotatable around an axis in a given direction. Similarly, the DUT could be attached on a rod or a support, which could be rotated around an axis. The problem is that the rotational tables themselves or the rods/support mechanisms as such interfere the RF field, and they create additional reflecting surfaces during the RF measurements. Thus, there is a need to minimize the amount of harmful physical structures near the measurement antennas (i.e. near the DUT and around the respective other device/antennas).

One problem is that the antennas applied high frequencies in a smartphone are not necessarily in the center of the device housing. To be more precise, we can discuss about the phase center of the applied antenna system. The phase center in the conventional smart phone does not locate in the center of the apparatus's housing. Instead, the phase center usually locates near the corners or the edges of the device. Thus, when such a DUT is rotated around its central point or mass center, the phase center of the antenna system would e.g. go up and down around a circle (if the device is not locating all the time on a horizontal plane). This is a disadvantage and it would decrease the quality of the performed measurements.

The main purpose or problem thus would be finding a single place, where the phase center of the antennas of the DUT would locate even during a rotational action of the DUT, without creating too much RF reflective surfaces near the measurement area.

German publication DE 102011082008 ("Antretter") discloses a device for 3-dimensional positioning of a measurement object in an RF measuring chamber. Antretter presents a motorized rotational table or platform in FIG. 1, where a first rotating piece 10 (i.e. retainer) has been set with a rotating axis along the line of 31a . . . 31b. Inside part 10, there is another rotating piece 11 (i.e. socket) whose rotating axis 32 is set in an orthogonal axis compared to axis 31a-b. There is an elevated platform 22 (i.e. carrying element) on which two vertical support pillars 20, 21 are mounted and the support pillars are holding the first rotational shaft. There is a hole in the center of the platform to allow free rotation of the two pieces. In paragraph [0028] of Antretter (fifth paragraph after the brief description of drawings), support bolts 30, carrying element 22 on top of them, support pillars 20 & 21 on top of part 22, retainer 10, and round-shaped holed socket 11 could all be manufactured from material which is transparent in the "view" of the RF signals. This material has been mentioned to preferably be Styropor (polystyrene) or Rohacell. The last sentence of paragraph [0028] mentions that all parts and elements above the carrying (base) plate 24/24a could be manufactured from such an RF-transparent material. In Antretter, there is only a single mention of the word "Rohacell" in the whole description.

Rohacell® as such is a known material used e.g. in various military applications, such as airborne vehicles i.e. airplanes. Also automotive industries and medical applications have applied Rohacell when lightweight parts have been desired. Rohacell is a registered trademark of Evonik. Rohacell is chemically comprised of polymethacrylimide (i.e. PMI). Rohacell can endure temperatures up to 210° C. without harm. The dynamic strength of the material is good and mechanical properties are also excellent over a wide temperature range. The material is of a sandwich-type, having a cell structure where cell sizes can be tailored according to the used processing method. The material can be processed into various forms with several different machining methods, and also thermoforming into complex geometries or shapes is possible.

Chinese companies have also researched similar materials, such as Tasuns Composite Technology Co., Ltd and Hunan Rifeng Composite Co., Ltd. Their related products have been called as Tasuns PMI structural foam and Rifeng® Polymethacrylimide (PMI) foam, respectively.

Still, there is a need in measurement solutions for making the measurement environment to affect the radio channel as little as possible. At the same time, there should be some functionality to ensure that the DUT(s) can be easily manipulated i.e. rotated in order to perform radio measurements in different alignment angles. Also, there is a need to allow the measurements to be performed in different temperatures, which gives added restrictions to the structural features within the echoless chamber. These are the problems of the known solutions.

SUMMARY OF THE INVENTION

The present invention introduces a testing arrangement for a Device Under Test (i.e. DUT), where the DUT can be manipulated in various positions and alignments but without creating any new RF signal disturbances affecting the measurements. A main idea is to apply RF transparent material as a support and rotational platform (i.e. as an inner compartment) for the DUT. Such an RF transparent material can be Rohacell, which is polymethacrylimide (PMI) based structural foam, a known material as such. The RF transparent material is designed in specific shapes and subparts used to support and fix the DUT in a certain position and alignment. The inner compartment made of the RF transparent material can be rotated with appropriate rotational arrangement which can be preferably designed in a way that they add only minimum effects to the measurements as such (small size, less reflective, minor absorbance to RF signals). The RF transparent material can be applied in as many parts as physically possible, as e.g. polymethacrylimide has good dynamical strength properties. In addition to rotational movement, also direct movement in X-Y-Z coordinates can be enabled. For instance, this is made by moving the arrangement in a single direction (and back) on top of a wheel or a conveyor belt system, where the DUT's center position can be changed along a direct line of positions. Testing in different temperatures is made possible by having an air input and output, a compressor, and through-holes in the wall of the inner compartment to obtain contact of the fed air with the DUT.

The present invention introduces, in its first aspect, a rotatable inner compartment (11, 21, 31, 41) applicable to fix, rotate and/or move a device under test, DUT (12, 22, 32, 42), which is characterized in that the inner compartment (11, 21, 31, 41) is manufactured of polymethacrylimide or other substantially RF-transparent material, and that the inner compartment encloses the DUT or holds the DUT or attaches to the DUT so that the DUT is fixed in relation to the inner compartment, and the DUT is being placed substantially in the middle of the inner compartment, wherein the inner compartment (11, 21, 31, 41) is configured to be rotatable by a rotational force creation means so that the DUT (12, 22, 32, 42) can be placed in a desired alignment angle between two conducted measurements requiring two different alignment angles, and the inner compartment (11, 21, 31, 41) is configured to be kept in its place and fixed with the DUT (12, 22, 32, 42) during a single conducted measurement.

In an embodiment of the present invention, the inner compartment (11, 21, 31, 41) is made as a hollow ball, and from one or more pieces.

In an embodiment of the present invention, the DUT is configured to be attached between two symmetrical pieces, which pieces are part of a complete, hollow ball.

In an embodiment of the present invention, the DUT is configured to be attached with support rods (34, 44) inside the hollow ball, so that the DUT locates centrally within the inner compartment.

In an embodiment of the present invention, an inner volume of the inner compartment, except a space meant for the DUT, is configured to be filled with pieces or blocks of material, or other added filling material, for fixing the DUT in its place in view of the inner compartment.

In an embodiment of the present invention, the support rods (34, 44) and the pieces or blocks of material are manufactured of polymethacrylimide or other substantially RF-transparent material.

In an embodiment of the present invention, the inner compartment (11, 21, 31, 41) with the DUT (12, 22, 32, 42) is placed inside an outer compartment (48), where the outer compartment (48) is an echoless measurement chamber.

In an embodiment of the present invention, the round-shaped inner compartment (11, 21, 31, 41) with the DUT (12, 22, 32, 42) is placed inside a rectangular-shaped outer compartment (48) concentrically, where support elements (47) allow the rotation of the inner compartment inside the outer compartment, where a first motor (43a) as the rotational force creation means is configured to rotate the inner compartment (11, 21, 31, 41) to a desired alignment angle of the DUT and a second motor (43b) is configured to linearly move the outer compartment (48) to a desired location in (X,Y,Z)-coordinates.

In an embodiment of the present invention, walls of the round-shaped inner compartment comprise at least two through-holes (23), allowing air to circulate between an inner volume of the inner compartment, and the volume between the inner and outer compartments.

In an embodiment of the present invention, the volume between the inner and outer compartments is supplied with incoming air of desired temperature by a compressor (49), allowing thermal testing of the DUT in the desired temperature.

In an embodiment of the present invention, an input air piping (49a) for the incoming air, and an output air piping (49b) for the exiting air locate substantially on opposite walls or near opposite corners of the outer compartment.

In an embodiment of the present invention, the rotational force creation means is a first motor (43a), whose rotational force is transferred to the outer surface of the inner compartment by a conveyor belt (52), or by a controllable ball joint (72), or by other force transferring means capable of creating a rotating force along a tangent of the outer surface of the inner compartment by frictional force.

In an embodiment of the present invention, fixing elements (13) are used for securing the connection between two half-spheres of the inner compartment during the assembly of the arrangement.

In an embodiment of the present invention, the outer compartment is configured to locate on wheels or on a second conveyor belt (45), where the second motor (43b) is configured to move the arrangement horizontally on the wheels or on the second conveyor belt (45).

In an embodiment of the present invention, a controller is configured to calculate a phase center of the DUT (12, 22, 32, 42) in view of the center point of the DUT during rotation of the DUT, and that the controller is configured to move the inner compartment (11, 21, 31, 41) with the DUT by an X-Y-Z mover during the rotation so that the phase center of the DUT will remain stationary during the rotation.

In an embodiment of the present invention, the calculation step is made by a SAR measurement, and the moving step is implemented by a dedicated algorithm executed in the controller.

In an embodiment of the present invention, the through-holes (23) are provided with removable plugging elements (33) made from RF transparent material for fixed temperature testing, and when starting a varying temperature testing, removing the plugging elements (33) from the inner compartment (31).

In an embodiment of the present invention, for sensing the alignment angle of the DUT (42), using visual patterning on the outer surface of the inner compartment (41), and by detecting these patterns by an appropriately directed camera or cameras.

In an embodiment of the present invention, the selected substantially RF-transparent material comprises carbon particles either as part of a mixture of substances, or carbon as part of a coating on a reflecting surface.

In an embodiment of the present invention, the inner compartment (11, 21, 31, 41) rests on top of at least three support balls or wheels, which comprise rubber.

The inventive concept also comprises, in its second aspect, a method for testing a device under test, DUT (12, 22, 32, 42), with at least two alignment angles, and possibly with varying temperatures, which is characterized in that the method comprises the steps of:
  placing the DUT substantially in the middle of an inner compartment (11, 21, 31, 41) manufactured of polymethacrylimide or other substantially RF-transparent material, where the inner compartment encloses the DUT or holds the DUT or attaches to the DUT, and where the DUT is fixed in relation to the inner compartment,
  rotating the inner compartment (11, 21, 31, 41) by a rotational force creation means so that the DUT (12, 22, 32, 42) can be placed in a desired alignment angle between two conducted measurements requiring two different alignment angles, and
  keeping the inner compartment (11, 21, 31, 41) in its place and fixed with the DUT (12, 22, 32, 42) during a single conducted measurement.

In an embodiment of the present invention, when testing with varying temperatures, the method further comprises the steps of:
  placing the inner compartment (11, 21, 31, 41) with the DUT (12, 22, 32, 42) inside an outer compartment (48), wherein
  the wall of the inner compartment comprises at least two through-holes (23), where further
  feeding incoming air of a desired temperature via an input air piping (49a) to a volume between the outer and inner compartments, the fed air reaching also the outer surfaces of the DUT (12, 22, 32, 42), and
  directing the excess air from the volume between the outer and inner compartments via an output air piping (49b).

In an embodiment of the present invention, the outer compartment (48) and support rods (44) for the DUT (12, 22, 32, 42) are manufactured of polymethacrylimide or other substantially RF-transparent material.

In an embodiment of the present invention, the method further comprises the steps of:
  calculating, by a controller, a phase center of the DUT (12, 22, 32, 42) in view of the center point of the DUT during rotation of the DUT, and
  moving, by the controller, the inner compartment (11, 21, 31, 41) with the DUT by an X-Y-Z mover during the rotation so that the phase center of the DUT will remain stationary during the rotation.

DETAILED DESCRIPTION OF THE INVENTION

The present invention introduces a supporting and rotating platform for a DUT, where the platform to be manipulated may have various designs and shapes. The platform is preferably made of RF transparent material which makes the supportive material to affect the actual conducted measurements negligibly or otherwise in a minimal manner. The selected RF transparent material is preferably PMI (=polymethacrylimide), and a useful shape for the RF transparent material is a hollow ball, which is possibly filled with PMI-made rods or other filling material for securing the DUT firmly in its place inside the hollow spherically shaped material.

The aspects of the present invention comprise a rotatable inner compartment (i.e. the invented testing arrangement), a method for testing a DUT with at least two alignment angles and possibly with varying temperatures, and also a computer program and a respective computer program product for implementing applicable method steps.

Figure 1:
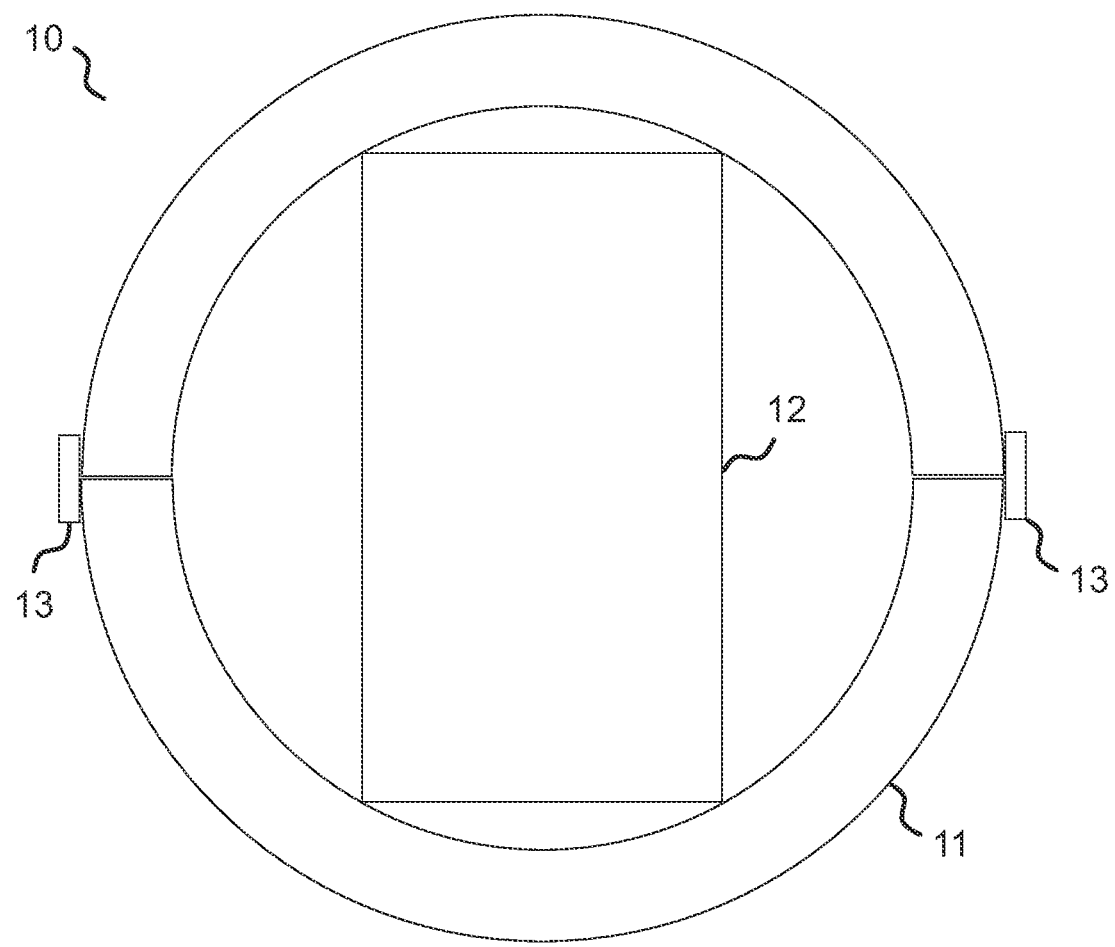
FIG. 1 illustrates a substantially circularly shaped hollow PMI ball as an inner compartment, which may support and manipulate a DUT within it, the ball constructed from two half-spheres, representing an embodiment of the present invention.

FIG. 1 illustrates a first simple embodiment 10 of the present invention. Two pieces of RF transparent material 11 have here a half-spherical shape, and they form together an inner compartment. PMI or other RF transparent material is applied as the material of the hollow ball or sphere. In this embodiment, the thickness of the material 11 ball is uniform across the sphere. Further in this embodiment, a lower half of the material 11 ball can be separately placed on a given base (e.g. floor of a testing chamber, for instance), and a DUT 12 may then be inserted into the lower half of the RF transparent material. In this simple example, the DUT 12 may be placed in a resting position along the curved inner surface of the hollow half-sphere. Other connection manners inside the hollow ball are presented later. In the example of FIG. 1, a second hollow half-sphere of the RF transparent material is placed on top of the first piece to complete the hollow ball comprising the DUT 12. The purpose is to fix the DUT 12 inside the ball so that due to friction, it follows the rotational movements of the material 11 ball. The attachment of the DUT 12 within the ball can be made so that DUT 12 is not physically affected, as PMI is not a metal-like substance, but more of a styrox type of material. In an embodiment not shown in the figure, there can be inner angular carvings within the inner surface of the hollow ball, in order to place a rectangular (or close to rectangular) DUT (e.g. smartphone) in the volume defined by the inner angular carvings. Thus, the fixation of the DUT 12 within the ball can be enhanced, and the connection between the two is firm. In FIG. 1, there are further two fixing elements 13 for securing the connection between the two half-spheres. The connection can preferably be opened and closed several times, in order to give easy releasing possibilities for the DUT after the actual measurements have been conducted. The fixing elements 13 can be made from PMI or other RF transparent material as well. In another embodiment, the material can be e.g. plastic or even metal, but the element 13 size must then be small, for not obstructing the RF environment. The fixing elements 13 may apply a screwing type of connection into the material 11 ball. Only two fixing elements 13 are shown in the figure, but or course, this number of fixing elements 13 can be any appropriate number of attachment points along this horizontal plane (here right in the middle of FIG. 1).

Figure 2:
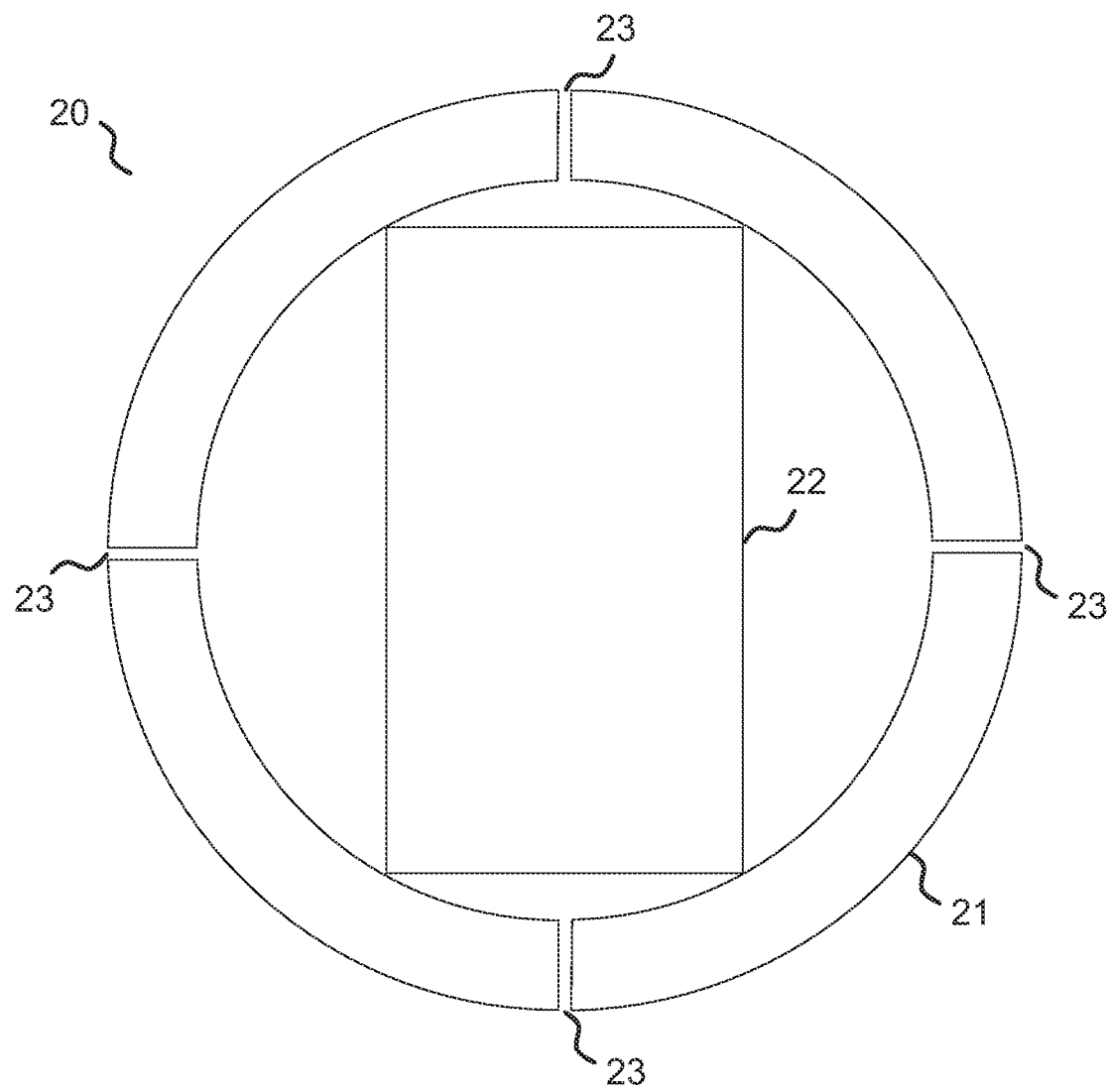
FIG. 2 illustrates another embodiment provided with a plurality of through-holes across the hollow PMI ball within the structure of FIG. 1.

FIG. 2 illustrates a simple embodiment 20, which enables testing of the DUT 22 in various temperatures. The material 21 ball (i.e. the inner compartment 21) can be manufactured from two hollow half-spheres as in FIG. 1. However, in another embodiment, the material 21 ball can be assembled and disassembled from/into two or more pieces of material with a freely selected shapes and seam formations. In FIG. 2, the DUT 22 is placed right into contact with the inner surfaces of the hollow ball made of the RF transparent material. However, other attachment principles can be applied as well, such as connecting rods or filling pieces inside the ball, such as a piece with horizontal top surface located in the bottom of the inner volume of the hollow ball. Such a horizontal "platform" for the DUT 22 may be supplied with an adhesive surface and/or plastic clips around the DUT 22 position so that the DUT 22 can be clipped and attached to the "platform".

A main added feature compared to FIG. 1 embodiment is that FIG. 2 comprises a plurality of through-holes 23 for enabling circulation of air having a desired temperature, where the air is able to reach the surfaces of the DUT 22 once it is fed into the chamber or respective volume where the hollow ball structure is located. The system enabling testing in different temperatures may have a compressor which may supply air flow into a test chamber where the structure according to FIG. 2 is placed. Then as air in a given temperature reaches the outer surfaces of the material 21 ball, this air will also enter the inner volume of the material 21 ball via throughholes 23. Of course, the higher temperature of the functioning smartphone compared to regular room temperature can result in a situation where the air temperature inside the material 21 ball remains higher (as it is a much more closed volume) than outside the material 21 ball. However, the inner volume of the material 21 ball could be provided with a temperature sensor (not shown) which can be used to verify the actual DUT 22 temperature. This feedback can be used in setting a correct temperature for the output air released from a compressor output.

In an embodiment, the through-holes 23 may be drilled-type of direct, circular holes having a given diameter. Such a hole diameter can be e.g. in the range of 1 to 2 cm but of course this is just an example.

FIG. 2 enables a measurement setup where the DUT 22 is first tested in a first specified temperature with all required alignments and positions. After the measurements in the first temperature are completed, the air temperature can be adjusted in the arrangement so that the DUT 22 experiences a second temperature value. A second set of measurements are performed in various alignments and positions of the DUT 22, and when they are completed, the process may continue with a third temperature (and so on), or deemed to be completed. Also temperature cycle measurements are thus enabled with such an arrangement.

The alignment angle and position changing processes are described later in more detail.

Figure 3:
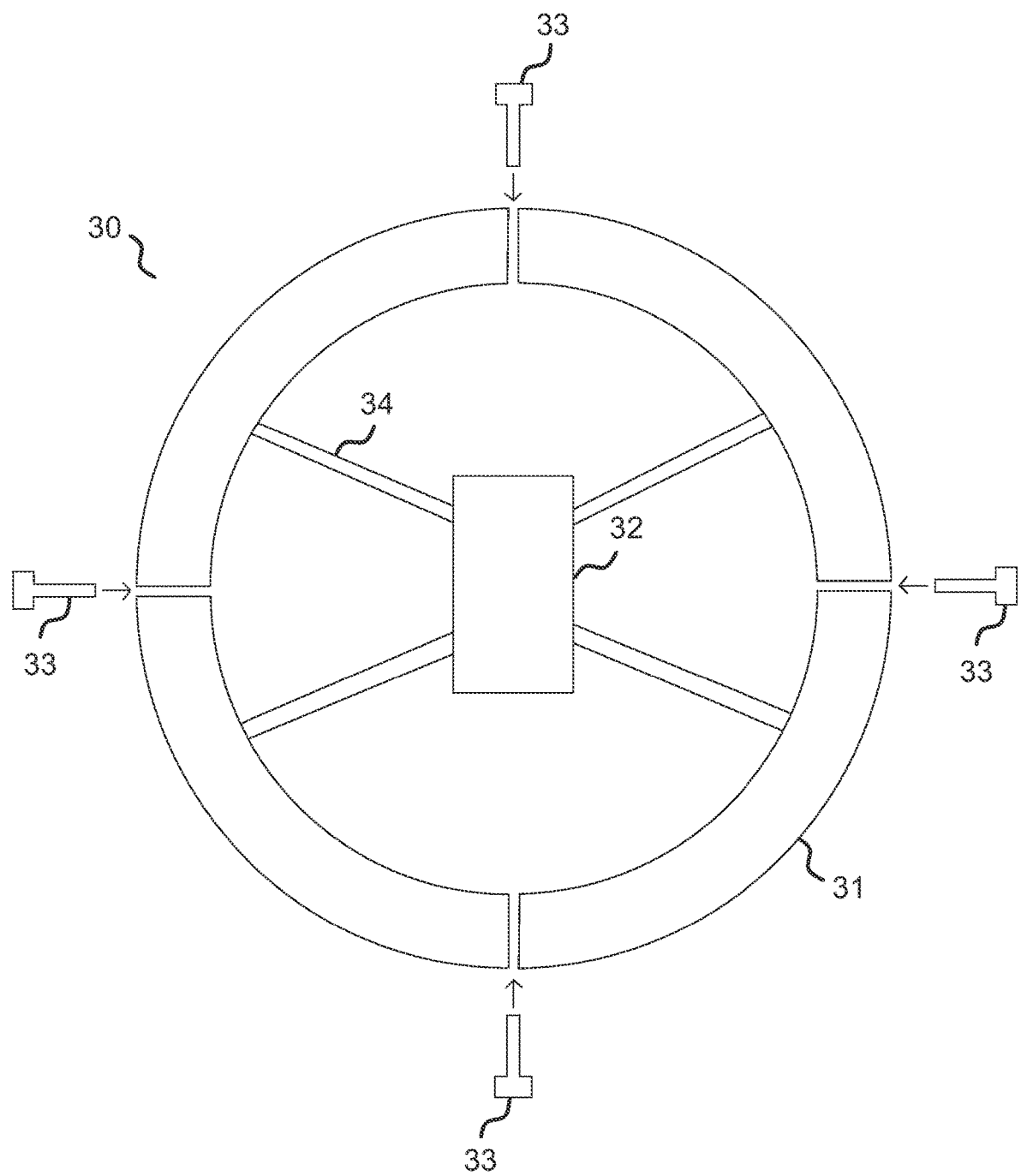
FIG. 3 illustrates a larger PMI ball having supportive rods made of PMI, which keep a smaller DUT fixed in the middle of the sphere, with plugged or unplugged throughholes within the ball.

FIG. 3 illustrates a third embodiment 30 of the present invention. In this embodiment, the DUT 32 is fixed differently to the inner surface of the RF transparent material 31 ball (i.e. the inner compartment 31). However, the shown dimensions and respective sizes compared to the other elements in the figure are merely exemplary. The third embodiment 30 shows support rods 34 which are used to fix the DUT 32 firmly in its place e.g. in the center of the hollow material 31 ball. The rods 34 can be also manufactured from the same RF transparent material, such as PMI. Four rods 34 are illustrated in FIG. 3 but any appropriate number of rods (i.e. support elements) can be applied. In one embodiment, the inner volume of the RF transparent material 31 ball can be provided with two oppositely located support rods, which have a DUT-sized gap in between the ends of the rods. The ends of the rods may have a flexible or string-operated end module, which may shorten a bit when applied a force onto it. This enables placing the DUT side or corner onto the rod end so that the opposite rod end can be released in a way that the string-type of force presses the rod ends towards the DUT 32. An appropriate receptacle-type of rod end may be used to ensure that the corner of the DUT 32 stays unmoved in relation to the rod, when actual measurements and system rotations are performed. Thus, a fixed arrangement enabling the movement and the rotation of the DUT 32 is achieved.

In an alternative embodiment, the support rods 34 can be replaced by some RF transparent foam-type of material which keeps the DUT 32 fixed in view of the material 31 ball. A bottom half of the material 31 ball can be filled with foam first, and thereafter, the DUT 32 may be placed on the layer of foam, possibly after shaping a DUT-shaped volume on top of the foam. Then, another half-sphere filled with foam material can be placed on top of the previously made half-sphere, thus completing the hollow material 31 ball filled with DUT 32 and RF transparent foam. There can be at least one connecting element between the two halves of the material 31 ball, in order to maintain the ball as an intact structure during rotations and measurements. FIG. 3 also shows four through-holes as an example for varying temperature measurements. Furthermore, in an embodiment, the through-holes may have a plugging element 33 in each of the holes. The plugging elements 33 can also be made from RF transparent material, such as PMI. The plugging elements 33 may be kept in the structure if there is no need for tests requiring varying temperatures. However, when the need for varying temperature testing emerges, the system can be easily adapted to fulfil this need by just removing the plugging elements 33 from the material 31 ball. The plugging elements 33 may have a screw-typed insertion and removal principles. Summarizing the third embodiment 30, it allows temperature testing, and also varying sizes of DUTs 32, no matter how much larger diameter the hollow PMI ball has compared to the dimensions of the DUT 32. Still, the third embodiment 30 allows maintaining the DUT 32 in a fixed position in relation to the PMI ball, e.g. in its center point.

Figure 4:
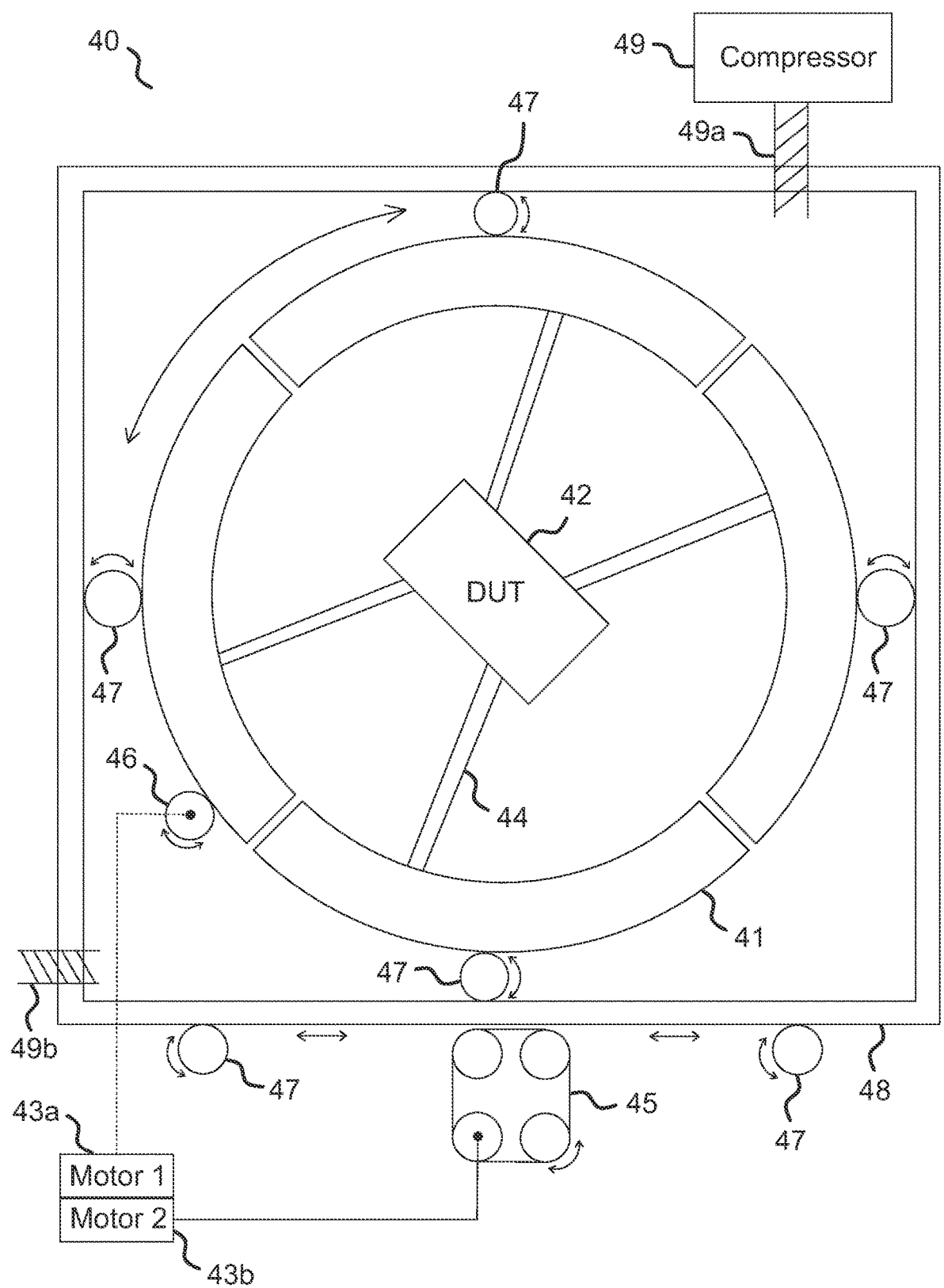
FIG. 4 illustrates a more complex structure where an outer PMI box (i.e. an outer compartment) may be moved in at least one direction (to left and right), and where an inner PMI-made compartment comprising the DUT can be rotated within the outer box, the arrangement controlled by two independent motors.

FIG. 4 illustrates a more detailed embodiment, i.e. a fourth embodiment 40 of the present invention. In this exemplary and a bit more complicated structure, embodiment 40 comprises two nested compartments made from the RF transparent material, such as PMI. The inner compartment 41 can be the ball structure familiar from FIG. 3, for instance (corresponding to part 31). The inner compartment 41 comprises a DUT 42, which can be attached with support structures such as support rods 44 to the ball structure. Of course, the functionality of the support rods 44 can be replaced by other filling material inside the ball, where the filling material is made of RF transparent material. Such a material can also be a wedged-type material piece or pieces, also made of the RF transparent material, like e.g. PMI. The wedged pieces can fill the inner volume of the ball structure 41 in a way that the DUT 42 (without rods) will locate and stay in its location and alignment angle in view of the RF transparent ball 41, even when rotating the RF transparent ball 41. Thus, the wedged pieces can be shaped appropriately, such as stacked rectangular elements, so that the remaining free volume in the RF transparent ball 41 is exactly of the size of the DUT 42.

An outer compartment 48 is in this example shown as a cubical, and hollow enclosed box, but the structure can also be rectangular or even round-shaped, if desired. In the present invention, also the outer compartment 48 is made of RF transparent material, in an embodiment. The purpose of the outer compartment 48 is to enable direct (=linear) movement of the DUT 42 in one, two or three directions (such as X, Y, Z directions in a respective coordinate system). However, the purpose of the inner compartment 41 (i.e. the ball structure) is to enable rotation of the DUT 42 in a given positional location. For fixing the central locations of the inner 41 and outer 48 compartments to a same spot, the two compartments 41, 48 are provided with support elements like e.g. support rolls 47 (e.g. freely rotating balls) between the two compartments 41, 48. Even the support rolls or support balls 47 can be manufactured of RF transparent material, such as PMI. FIG. 4 shows support rolls 47 on all four inner sides of the cubical outer compartment 48 but the present invention is not restricted to merely this supporting rolls arrangement as shown. The main feature in this sense is the "inter-movability" within the system; the inner ball 41 can controllably be rotated within an outer chamber 48. The controlled rotational force is in this example created by a first motor 43a, i.e. "Motor 1". The force from the motor is here directed to a rotational power transfer element, i.e. controllable roll or ball 46 which has the capability to rotate the inner compartment 41, i.e. the ball with the DUT 42, with the help of friction between elements 46 and 41. As the support rolls or balls 47 are not motor-driven, but freely rotatable, the ball 41 and the DUT 42 within it will rotate as controlled by the first motor 43a. An external PC can be set up outside the measurement chamber to provide the actual interface for controlling the motor(s). The interface may simply allow a user to enter an alignment angle between 0 . . . 360 degrees, and when triggering such a command, the first motor 43a will set the inner ball structure 41 with the DUT 42 in that selected angular alignment.

Next, we discuss the position setting possibilities in a linear scale, e.g. in X-, Y- or Z-direction in the coordinate system determined by the planes of the cubical chamber, i.e. outer compartment 48. For simplicity, the linear movement possibility is depicted as a movement along an X-axis, i.e. in a left-right direction shown by the direct arrows in FIG. 4. The linear movement can also be triggered by the user with an external computer interface. This time the actuating force creation element is a second motor, i.e. "Motor 2" 43b. The force transfer element i.e. means between the second motor 43b and the outer chamber 48 is shown with four rotating cylinders and a conveyor belt around them, 45, for simplicity. Still, the present invention is not meant to be restricted only to this kind of force transfer means. In any way, the rotational energy from the second motor 43b can be directed, via friction between elements 45 and the bottom surface of the outer compartment 48, to a linear horizontal movement of the inner and outer compartments 41, 48. This is done for setting an exact wanted location of the DUT 42 for the testing. The two lowermost support rolls or support balls 47 are just assisting support elements allowing smooth gliding of the arrangement from left to right or from right to left, without unwanted tilting. The parameter which the user can enter via an external computer interface, can be a coordinate parameter in one or more direction (X-, Y- or Z-), or a deviation e.g. in centimeters from the central position of the DUT 42, for instance.

Next, we discuss the DUT 42 testing in different temperatures. This is allowed by the dual chamber structure, air pathways across the wall of the inner compartment 41, and a system for circulating air having a determined temperature. The last part of the above is realized by a compressor 49, input air piping 49a to a volume inside the outer compartment 48 but outside the inner compartment 41, and an output air piping 49b between the above determined volume and ambient environment. The external computer may be used to set a desired temperature in which the DUT 42 needs to be tested. The compressor 49 may then be set to feed air in that specified temperature to enter the outer compartment 48 via input air piping 49*a*. The desired temperature could be verified by a small temperature sensor (not shown) which could be attached on the support rod 44, and which of course needs to be in connection with the external computer. The pathway for the air to enter and circulate within the whole inner air volume and also the outer surfaces of the DUT 42 is created by the through-holes (four of them shown symmetrically through the inner ball structure 41, which is merely an exemplary number). The output air piping 49*b* is here located in an opposite corner of the outer compartment 48, in order to allow proper circulation and ventilation of the air, while maintaining the DUT 42 in the correct temperature during the measurement.

Thus, as a summary, the user may set three different parameters for an RF measurement involving the DUT 42: The coordinate position (X, Y, Z) of the DUT 42, the rotational angular alignment of the DUT 42, and the temperature in which the DUT measurement is needed to be executed. As many physical parts as possible are implemented with an RF transparent material, which still is dynamically strong and solid material. PMI is one good example of such a material, in an embodiment of the present invention. If PMI cannot be used in a given physical element (like it is the case for a voluntary temperature sensor), their sizes are selected or designed to be as small as functionally possible. In an embodiment, the outer compartment 48 can be rather large, like a regular unechoic measurement chamber. Everything or at least as much as possible inside this large outer compartment 48 could be in practice manufactured of the PMI material, and small-sized wirings concerning the control for element 46 can be added thereto. Thus, there is a large maneuvreability of the DUT 42, but during the measurements applying specific RF beams, the beams won't be affected by harmful metal surfaces or elements, as it normally (in prior art) would do. It can be said that the DUT 42 can be set "floating" in the chamber, and manipulated in many ways, while the manipulating structures won't have a harmful effect in the measurements themselves. This is the main advantage of the present invention, and a clear difference to commonly known RF measurement chambers and moving devices.

For practical punctuality regarding a large outer compartment 48 and a smaller inner compartment 41, we note that the support rolls or balls 47 must then be completed with an extended system of support rods, for instance. By this we mean that each support roll or ball 47 could be fixed on top of an additional support rod fixed on the inner surfaces of the cubical outer compartment 48. The rolls of course need to have free rotational capabilities also in this embodiment. The additional support rods could also be made of PMI, or a corresponding material regarding RF signal behaviour. In this way, the outer compartment 48 size could be significantly larger than the size of the inner compartment 41 (i.e. the PMI ball). In other words, the relative sizes of the two compartments 41, 48 can vary a lot more than what would be expected based on FIG. 4. In an embodiment, the outer compartment 48 can even be an echoless measurement chamber, designed for RF measurements, and maybe having a size of a container or even more. Such an outer compartment further can be made of metal (if it has enough large inner volume), and provided with RF absorbers on the inner walls for mitigating reflections inside the chamber.

One further advantage of the arrangement shown in FIG. 4 is that the temperature for the measurement can be easily altered. This enables various RF measurement schemes which apply several different testing temperatures. The same arrangement of the embodiment 40 can be used without a need to alter any substantial part or element during the temperature testing (i.e. temperature cycling).

One advantage is that the two-compartment structure protects the tested DUT 42 from other unwanted ambient (i.e. environmental) effects. Alternatively, the presented arrangement allows also to set up some other physical characteristics within the inner compartment 41, such as a desired humidity of the input air (for just mentioning an example).

One option for sensing the alignment angle of the DUT 42 is to use visual patterning on the outer surface of the inner compartment 41, and by "reading" (i.e. detecting) these patterns by an appropriately directed camera. The patterning could be implemented e.g. through painting a dedicated symbol, group of lines, or other visual illustration on the outer surface of the inner compartment 41. This visual sensing means acts as an "angular alignment sensor", which won't affect the RF channel, if the camera is placed far away from the created RF beams, for instance. The camera could be fixed on the inner surface of the outer compartment 48, and this system would work properly if the outer compartment 48 dimensions are relatively large. The camera's pointing angle, i.e. the optical axis could be controlled by the system, or for instance by the user via the external computer. In an embodiment, there can be several cameras around the inner compartment 41, pointing to it from different directions around the inner compartment 41.

Figure 5:
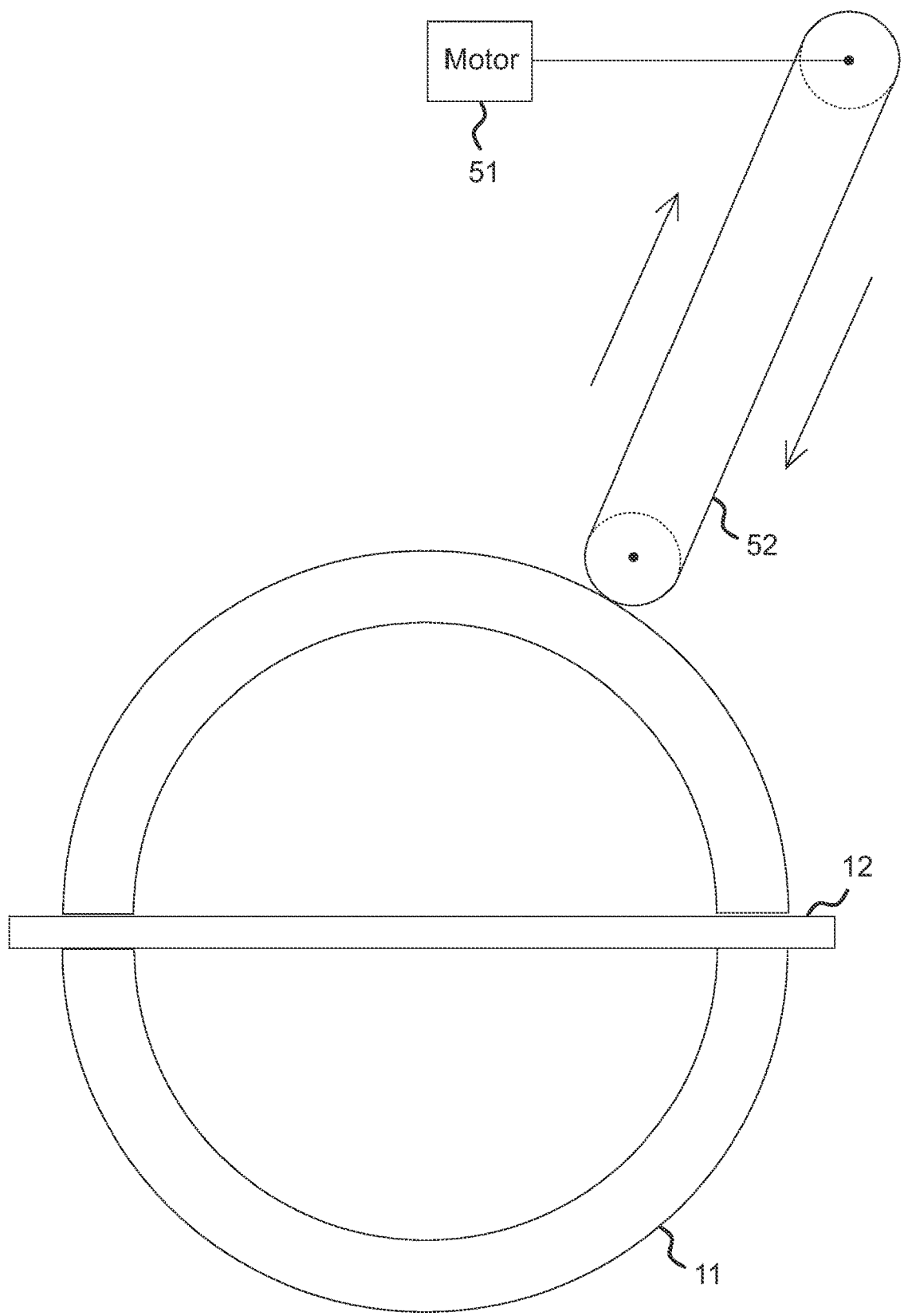
FIG. 5 illustrates a simple motor-driven rotation principle of the PMI-made inner compartment comprising two halves, and a DUT fixed in between them, with one rotation direction.
Figure 6:
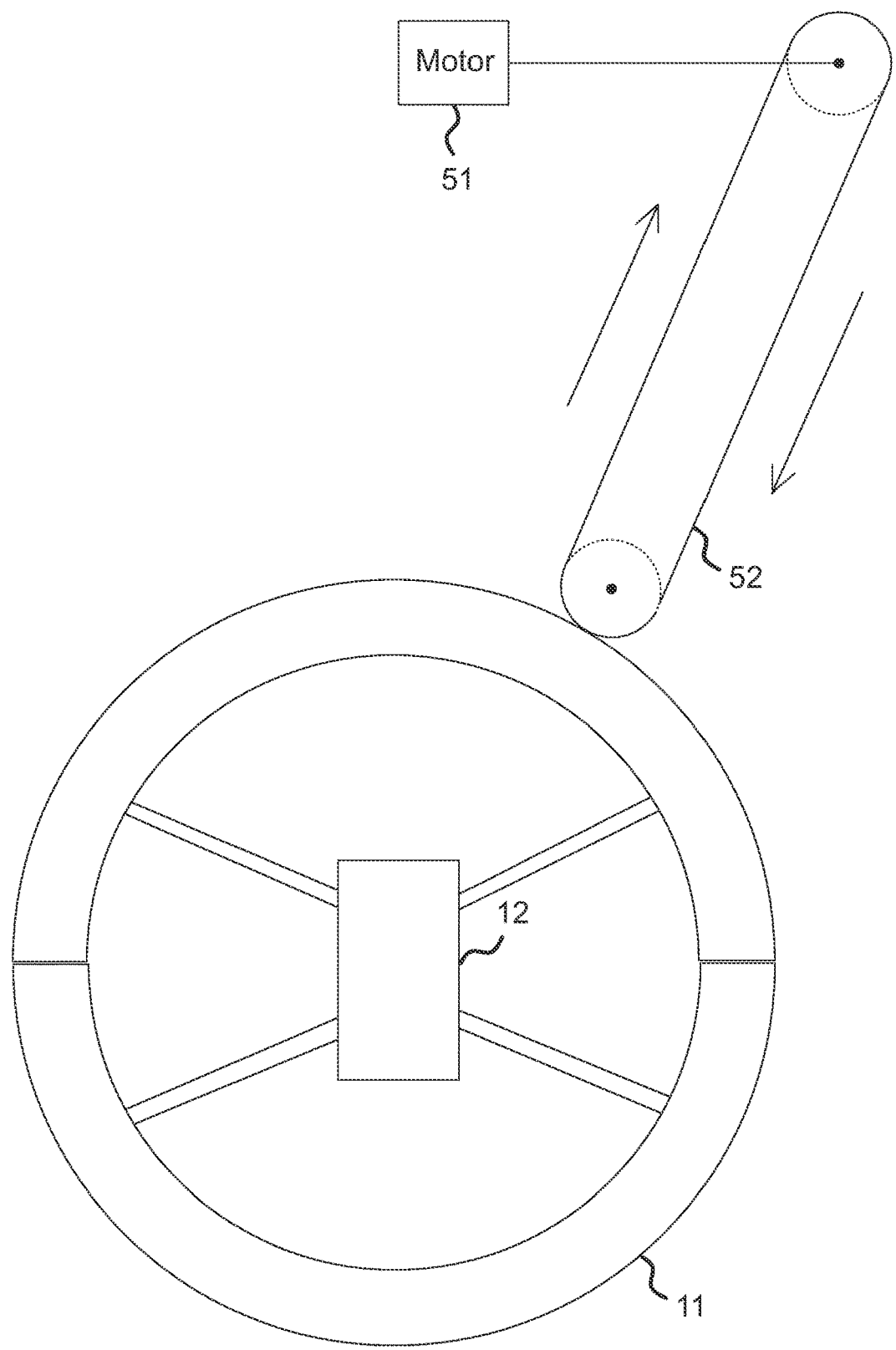
FIG. 6 illustrates a motor-driven, single rotation direction for a rod-connected DUT within the PMI-made inner compartment.
Figure 7:
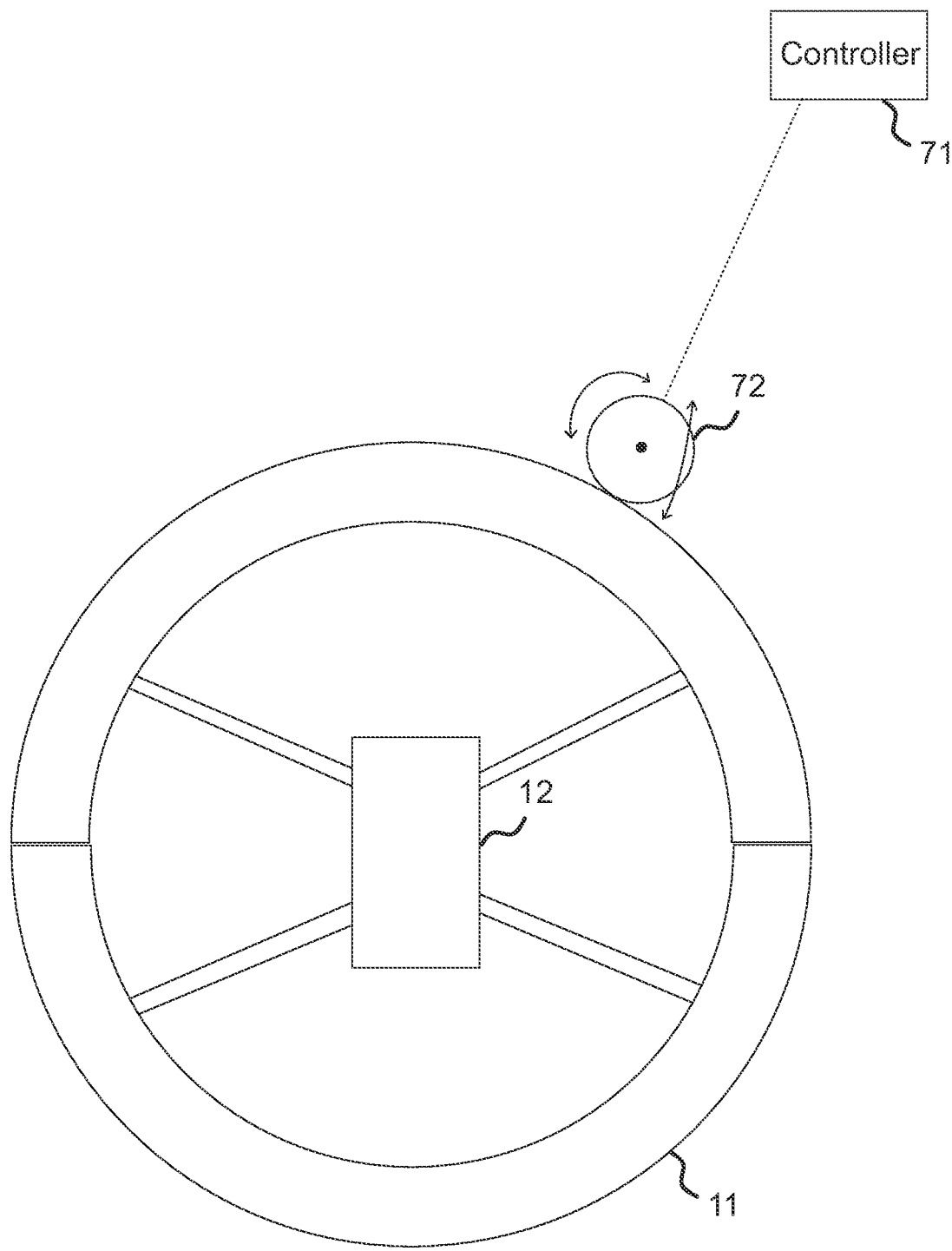
FIG. 7 illustrates a rotational principle for the inner compartment of FIG. 6, where a controller directs a ball joint allowing rotation of the DUT to any alignment angle of a ball (i.e. spherical) coordinate system.

FIGS. 5-7 show some examples on alternative structures and manners for rotating the inner compartment 11, 41, i.e. the support structure comprising or being connected with the DUT 12, 42 to be tested.

FIG. 5 shows a conveyor belt-type of structure for rotating the inner compartment 11. This allows the motor to locate well outside the measuring area, and thus not affecting the radio channel close to the DUT 12. This example also shows an alternative way of fixing the DUT 12 to a rotating support structure 11. This is made by attaching the DUT 12 between two halves of spherical PMI-based material pieces. These spherical pieces can be hollow, with a desired thickness of the ball itself. The halves' cut edges can be carved so that they can accommodate the shape of the DUT 12. One way of attaching the DUT 12 between the PMI ball halves is shown in FIG. 5. The connective portions may be applied with an adhesive material for ensuring the attachment between parts 11, 12 during the rotation motion. The adhesive material is selected so that the parts 11, 12 can also be easily removed from one another after the measurements. Many other possible ways of physical connection can be implemented, if the resulting combination of parts 11 and 12 is just symmetrical.

The rotating force is created by the motor 51 which can be placed well outside the testing area. The rotating force can be conveyed to the outer surface of the PMI ball 11 via a conveyor belt 52. Of course, there can be several conveyor belts, joints, or possibly gears for conveying the rotating force from the motor 51. In this way, a change in the rotation of the DUT 12 is achieved in a single rotational direction. The material of the conveyor belt and assisting rolls in this system can be manufactured from rigid, yet transparent material for the RF signals, to the extent where this is possible.

FIG. 6 shows yet another embodiment of the present invention. Here the motor 51 and the conveyor belt 52 arrangement follows the previous FIG. 5, but the DUT 12 and its connections to the inner walls of the inner compartment 11 follow FIGS. 3 and 4. Thus, we have an inner compartment 11 which is notably larger in its volume compared to the largest dimension of the DUT 12. The inner compartment 11 comprises two hollow, spherical halves of RF transparent material, which can be adhered together with a material, which allows the disassembly of the measurement arrangement as well. The DUT 12 can be attached with a number of support rods in the middle of the spherical inner compartment 11 (here with four rods), where the rods can be manufactured from RF transparent material as well. This system allows a much larger inner compartment 11 compared to the size of the DUT 12. Of course, the fixing principle of the DUT 12 within the inner volume of the inner compartment 11 can be something different; as long as the connection is enduring but yet removable after the actual measurements have been concluded. The rotating system of the system can be various, as long as there is a motor 51 and some movement/rotation transfer means like the conveyor belt-type of arrangement 52 we have in this example.

FIG. 7 shows a yet further embodiment, which allows rotation of the system in all directions in the spherical coordinates. For simplicity, the DUT 12 and the spherical inner compartment 11 are the same as the ones depicted in FIG. 6, but of course various other fixing manners for the DUT 12 are possible (as explained earlier). Now the rotational movements of the inner compartment 11 and the DUT 12 are made possible by having a ball joint 72 which is in a contact with the outer surface of the spherical inner compartment 11. The contact point of course requires proper friction between the ball joint 72 and the outer surface of the inner compartment 11. The inner compartment is made of PMI and shaped as a hollow material ball, in an embodiment. The support rods can also be manufactured from PMI, and shaped so that they can fixedly attach the DUT 12 in its place in the middle of the PMI-made ball. The ball joint 72 can be controlled by a controller 71 (i.e. a processor), which is able to give rotation angle turning instructions to the ball joint, either via wired connection, or via wireless connection. Of course the ball joint 72 could be provided with a local motor enabling the rotational action, or by a local controller, whose output control signal would turn the ball joint 72 so that the inner compartment 11 is turnable to a desired alignment angle for a subsequent measurement. As the ball joint itself could be manufactured from e.g. PMI, the other physical elements might affect the channel characteristics, and therefore, their placement must be properly considered. Still, a combination of a ball joint 72, some force transfer means to the ball joint 72, and a more remotely locating motor more far away from the inner compartment 11 is one feasible type of realizing the system. Then the controller 71 feeding the motor (i.e. outputting a control signal for the motor based on desired spherical coordinates wanted for the DUT 12) can also locate more far away from the actual measurement setup's area (i.e. the inner compartment 11 and its nearby volumetric areas), thus not disturbing the radio channel with reflective surfaces while performing the actual measurements.

In a yet further embodiment of the present invention, we present a slightly different arrangement having the embodiment according to FIG. 4 as a good starting point. Certain elements may be replaced by the following other structures or features. For instance, the rectangularly or cubically shaped outer compartment 48 can be replaced by a hollow ball-shaped structure. For instance, the outer compartment 48 may be a ball made of PMI, where its radius is bigger than the radius of the inner compartment 41. The outer compartment 48 need not to comprise the through-holes though, but merely the input/output air piping 49a-b should be provided in case thermal testing (i.e. at least two different temperatures during the testing scheme) is desired.

Furthermore, the support balls 46, 47 made of PMI may be alternatively made of rubber or comprise rubber, but still they should have relatively small diametric size in order to have a small effect on the RF measurements. In a further embodiment, the support balls 46, 47 may comprise carbon, as absorbed within the rubber or other material. The absorbed carbon has been noted to create similar effect than what PMI creates in view of the RF signals; i.e. relative transparency. The carbon may be absorbed by mixing rubber and powdered carbon particles, when manufacturing rubber balls or wheels. Alternatively, the outer surface of the rubber ball or wheel can be coated with a carbon- or carbon-based material coating. With the carbon-based material, we mean that there can be additional binder material mixing with the carbon particles, before the coating is made.

The inner compartment may locate on top of three or more rubber balls or wheels, so that the inner compartment may rest on top of these support balls or wheels, and rotate freely on top of the rotating rubber balls or wheels. As FIG. 4 also points out, the motor's 43a rotating force may be directed on the outer surface of the inner compartment via one of the rubber balls or wheels, or via a separate rotational force transfer element (like elements 52 and 72 in FIGS. 5-7).

In a further embodiment of the invention, the X-Y-Z movement of the arrangement is enabled a bit differently than shown in FIG. 4. The starting point in this embodiment is that a common DUT to be measured is a smartphone, whose antennas do not locate in the center of the device itself. In practice, the antennas locate usually in the corner areas or near the edges of the device, which means that the phase center of the antennas will also locate around the area where the antennas locate individually. One notable thing is that the whole housing of the smartphone will act as an antenna (i.e. as a radiator), and the phase center of this antenna arrangement will be somewhere within the housing volume of the smartphone. At least for the frequency range below 1 GHz it has been revealed that the phase center indeed locates inside the housing of the DUT, i.e. within the volume determined by the outer surfaces of the smartphone's housing. The location of the phase center depends on the antenna element type, the applied frequency, the location of the feeding point, and also on the dimensions of the DUT housing. Most likely, the phase center is still not in the center point or mass center location of the smartphone. Thus, there would be a problem with the presented rotational arrangement if the DUT is fixed directly in the center of the inner compartment.

In order to obtain the phase center information of the DUT, a SAR ("Specific Absorption Rate") measurement can be conducted. It is notable that the SAR measurement results may differ as a function of the used frequency. Therefore, the SAR measurement should be repeated for all applied frequencies in the actual testing. The SAR measurements can be applied to obtain more accurate results, and uncertainties in the measurements can be diminished.

Thus, in this further embodiment of the invention, the arrangement is provided with the controller and an algorithm, which controls the X-Y-Z mover to maintain the phase center of the DUT in a fixed position during the rotational movement of the inner compartment, no matter if the antennas locate near the edges or corners of the DUT. In other words, an X-Y-Z moving algorithm executed in the controller will compensate the locational difference between the phase center and the DUT center, which would otherwise result in a rotational movement of the phase center. As a result of the algorithm, and as a result of the active X-Y-Z movement of the arrangement based on the sensed position (i.e. rotational alignment), the phase center of the antennas of the DUT will remain stationary, which is a main goal in using the arrangement according to the present invention.

In other words, the X-Y-Z mover is a generalization of the units 45 and 43*b*, capable of moving the whole arrangement in all three axial directions based on a control signal provided by the controller and by the intelligent algorithm mentioned above. As the resulting movement as a function of time is a linear movement along three coordinate axis, the motor 43*b* can be generalized as any movement creation means.

In a further embodiment, the arrangement with the inner compartment and the X-Y-Z mover can be placed on a rotational platform, which can be rotated in order to find an advantageous starting point for the measurements. This means turning the arrangement to an angular position, with which the effects of the possible reflectors are minimized in the measurement area comprising the DUT and its counterpart device.

As a result of using an X-Y-Z mover and an intelligent moving algorithm to maintain the phase center of the DUT antennas stationary during rotational movement, the quiet zone will be very small in this case, and thus, the measurement quality will remain exceptionally good, because the signal level deviations in a small volumetric area will remain small. This is due to the fact that phase center will remain in practice stationary, and the possible reflectors in the surroundings of the DUT are both minimized concerning their numbers, and minimized regarding their reflecting surface areas.

One advantage of the present invention is that because the arrangement is a symmetrical structure, the DUT and its antennas will "see" the surrounding volume similarly, no matter what is the alignment angle of the inner compartment, and what is the location (i.e. direction) of the counterpart device in the measurement. This symmetricity makes the management of the measurements much easier, and it enhances the quality of the results.

Various different details of the control, motor, force transfer means, the rotating piece gripping to the outer surface of the inner compartment, the different topologies of the PMI ball (e.g. number of pieces), and the ways of attaching the DUT to the PMI ball can vary, and these different details i.e. features can be combined together in a manner appropriate in each desired measurement situation, and based on an available volume to be used in the RF measurements. In other words, the above disclosed details need not to be present like in a single FIG. 1 to 7, but various combinations among these Figures can be done to form a new embodiment of the measurement arrangement. Different details of various parts of the arrangement are thus combinable together very freely, as they all fulfil the basic requirements: RF transparent material in connection to the DUT 12, and a free rotatability of the RF transparent material without worsening too much the radio channel characteristics due to reflective or scattering surfaces.

A computer i.e. a PC or a server may be used to control the conducted measurements and movements/rotations between the conducted measurements, and also temperature selections for the measurements if desired. The computer can be a local computer, or a server locating remotely in a cloud, for instance. The presented method for testing a DUT may be implemented by steps defined in a computer program, when applicable. Thus, a respective computer program product is also an aspect of the present invention, together with the computer program itself. The computer program can be executed in a processor of the computer, thus implementing the method steps which are applicable to be performed by a processing device (i.e. the computer).

In an embodiment, the above concepts of a computer and a controller may be merged, i.e. they are then the same control element taking care of managing and controlling the measurements, and the rotational movements of the arrangement, and the linear movements obtained via the X-Y-Z mover. The merged computer/controller may also have access to a saving space (i.e. local memory or cloud), allowing the results to be stored, parameters to be set and viewed, and also other kinds of user access possibilities to the information/parameters relating to the arrangement, measurements and their set-up.

The present invention is not restricted merely to embodiments disclosed above, but the present invention may vary within the scope of the claims.

The invention claimed is:

1. A rotatable inner compartment adapted to fix, rotate and/or move a device under test (DUT), wherein the inner compartment is manufactured of polymethacrylimide or other substantially RF-transparent material, and wherein the inner compartment encloses the DUT or holds the DUT or attaches to the DUT so that the DUT is fixed in relation to the inner compartment, and the DUT is being placed substantially in a middle of the inner compartment, wherein
    the inner compartment is configured to be rotatable by rotational force creation means so that the DUT is positionable in a desired alignment angle between two conducted measurements requiring two different alignment angles,
    the inner compartment is configured to be kept in place and fixed with the DUT during a single conducted measurement, and
    a controller is configured to calculate a phase center of the DUT in view of a center point of the DUT during rotation of the DUT, and the controller is configured to move the inner compartment with the DUT by an X-Y-Z mover during rotation so that the phase center of the DUT will remain stationary during the rotation, wherein the phase center of the DUT is calculated by a Specific Absorption Rate (SAR), measurement using an applied frequency.

2. The inner compartment according to claim 1, wherein the inner compartment is made as a hollow ball, and from one or more pieces.

3. The inner compartment according to claim 2, wherein the DUT is configured to be attached between two symmetrical pieces, the pieces are part of a complete, hollow ball.

4. The inner compartment according to claim 2, wherein the DUT is configured to be attached with support rods inside the hollow ball, so that the DUT locates centrally within the inner compartment.

5. The inner compartment according to claim 2, wherein an inner volume of the inner compartment, except a space for the DUT, comprises pieces or blocks of material, or other added filling material, for fixing the DUT in place in view of the inner compartment.

6. The inner compartment according to claim 4, wherein the support rods and the pieces or blocks of material are manufactured of polymethacrylimide or other substantially RF-transparent material.

7. The inner compartment according to claim 1, wherein the inner compartment with the DUT is placed inside an outer compartment, wherein the outer compartment is an echoless measurement chamber.

8. The inner compartment according to claim 1, wherein a round-shaped inner compartment with the DUT is placed inside a rectangular-shaped outer compartment concentrically, wherein support elements allow rotation of the inner compartment inside the outer compartment, where a first motor as the rotational force creation means is configured to rotate the inner compartment to a desired alignment angle of the DUT and a second motor is configured to linearly move the outer compartment to a desired location in (X,Y,Z)-coordinates.

9. The inner compartment according to claim 8, wherein walls of the round-shaped inner compartment comprise at least two through-holes, allowing air to circulate between an inner volume of the inner compartment, and the volume between the inner and outer compartments.

10. The inner compartment according to claim 9, wherein the volume between the inner and outer compartments is supplied with incoming air of desired temperature by a compressor, allowing thermal testing of the DUT in the desired temperature.

11. The inner compartment according to claim 10, wherein an input air piping for the incoming air, and an output air piping for the exiting air locate substantially on opposite walls or proximate opposite corners of the outer compartment.

12. The inner compartment according to claim 1, wherein the rotational force creation means comprise a first motor, whose rotational force is transferred to an outer surface of the inner compartment by a conveyor belt (52), or by a controllable ball joint, or by other force transferring means capable of creating a rotating force along a tangent of the outer surface of the inner compartment by frictional force.

13. The inner compartment according to claim 1, wherein fixing elements secure the connection between two halfspheres of the inner compartment during the assembly.

14. The inner compartment according to claim 8, wherein the outer compartment is configured to locate on wheels or on a second conveyor belt, where the second motor is configured to move the the inner and outer compartments horizontally on the wheels or on the second conveyor belt.

15. The inner compartment according to claim 1, wherein moving is implemented by a dedicated algorithm executed in the controller.

16. The inner compartment according to claim 9, wherein the through-holes are provided with removable plugging elements made from RF transparent material for fixed temperature testing, and when starting a varying temperature testing, the plugging elements are configured to be removed from the inner compartment.

17. The inner compartment according to claim 1, wherein for sensing the alignment angle of the DUT, using visual patterning on an outer surface of the inner compartment, and by detecting patterns by an appropriately directed camera or cameras.

18. The inner compartment according to claim 1, wherein the selected substantially RF-transparent material comprises carbon particles either as part of a mixture of substances, or carbon as part of a coating on a reflecting surface.

19. The inner compartment according to claim 1, wherein the inner compartment rests on top of at least three support balls or wheels, which comprise rubber.

20. A method for testing a device under test (DUT), with at least two alignment angles, and enabling varying temperatures, wherein the method comprises the steps of:
placing the DUT substantially in a middle of an inner compartment manufactured of polymethacrylimide or other substantially RF-transparent material, wherein the inner compartment encloses the DUT or holds the DUT or attaches to the DUT, and wherein the DUT is fixed in relation to the inner compartment,
rotating the inner compartment by rotational force creation means so that the DUT is positionable in a desired alignment angle between two conducted measurements requiring two different alignment angles,
keeping the inner compartment in place and fixed with the DUT during a single conducted measurement,
calculating, by a controller, a phase center of the DUT in view of a center point of the DUT during rotation of the DUT, and
moving, by the controller, the inner compartment with the DUT by an X-Y-Z mover during the rotation so that the phase center of the DUT will remain stationary during the rotation, where the phase center of the DUT is calculated by a Specific Absorption Rate (SAR), measurement using an applied frequency.

21. The method according to claim 20, wherein when testing with varying temperatures, the method further comprises the steps of:
placing the inner compartment with the DUT inside an outer compartment, wherein
the wall of the inner compartment comprises at least two through-holes, and wherein
feeding incoming air of a desired temperature via an input air piping to a volume between the outer and inner compartments, the fed air also reaching outer surfaces of the DUT, and
directing the excess air from the volume between the outer and inner compartments via an output air piping.

22. The method according to claim 21, wherein the outer compartment and support rods for the DUT are manufactured of polymethacrylimide or other substantially RF-transparent material.

* * * * *